United States Patent
Kim et al.

(10) Patent No.: US 7,687,381 B2
(45) Date of Patent: Mar. 30, 2010

(54) METHOD OF FORMING ELECTRICAL INTERCONNECTS WITHIN INSULATING LAYERS THAT FORM CONSECUTIVE SIDEWALLS INCLUDING FORMING A REACTION LAYER ON THE INNER SIDEWALL

(75) Inventors: Jae-hak Kim, Seoul (KR); Jing Hui Li, Chongqing (CN); Wu Ping Liu, Singapore (SG); Johnny Widodo, Singapore (SG)

(73) Assignees: Samsung Electronics Co., Ltd. (KR); Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 12/051,223

(22) Filed: Mar. 19, 2008

(65) Prior Publication Data
US 2009/0239369 A1    Sep. 24, 2009

(51) Int. Cl.
H01L 21/46 (2006.01)
H01L 21/4763 (2006.01)
H01L 21/302 (2006.01)
H01L 21/461 (2006.01)

(52) U.S. Cl. .................. 438/498; 438/638; 438/725
(58) Field of Classification Search .......... 438/498, 438/638, 725; 257/E21.579
See application file for complete search history.

(56) References Cited

U.S. PATENT DOCUMENTS

| | | | |
|---|---|---|---|
| 2004/0018721 A1* | 1/2004 | Kim et al. | 438/637 |
| 2004/0038521 A1* | 2/2004 | Kim et al. | 438/637 |
| 2006/0019201 A1* | 1/2006 | Muramatsu et al. | 430/311 |

FOREIGN PATENT DOCUMENTS

| | | |
|---|---|---|
| JP | 2005-026482 | 1/2005 |
| KR | 1020040077307 A | 9/2004 |
| KR | 1020050110538 A | 11/2005 |
| KR | 1020060079420 A | 7/2006 |

* cited by examiner

Primary Examiner—William M. Brewster
(74) Attorney, Agent, or Firm—Myers Bigel Sibley & Sajovec

(57) ABSTRACT

Methods of forming integrated circuit device having electrical interconnects include forming an electrically insulating layer on a substrate and forming a hard mask on the electrically insulating layer. The hard mask and the electrically insulating layer are selectively etched in sequence using a mask to define an opening therein. This opening, which may be a via hole, exposes inner sidewalls of the hard mask and the electrically insulating layer. The inner sidewall of the hard mask is then recessed relative to the inner sidewall of the electrically insulating layer and a sacrificial reaction layer is formed on the inner sidewall of the electrically insulating layer. This reaction layer operates to recess the inner sidewall of the electrically insulating layer. The reaction layer is then removed to define a wider opening having relatively uniform sidewalls. This wider opening is then filled with an electrical interconnect.

18 Claims, 8 Drawing Sheets

METHOD OF FORMING ELECTRICAL INTERCONNECTS WITHIN INSULATING LAYERS THAT FORM CONSECUTIVE SIDEWALLS INCLUDING FORMING A REACTION LAYER ON THE INNER SIDEWALL

FIELD OF THE INVENTION

The present invention relates to methods of forming integrated circuit devices and, more particularly, to methods of forming integrated circuit devices having conductive patterns within insulating layers.

BACKGROUND OF THE INVENTION

Integrated circuit devices having high levels of device integration frequently utilize signal lines and electrically conductive device structures that are spaced closely to each other. In order to reduce parasitic coupling capacitances between the closely spaced signal lines and device structures, electrically insulating materials having relatively low dielectric constants have been considered as materials for electrically isolating signals lines and device structures from each other. The use of insulating materials with low dielectric constants improves device performance by reducing the RC time constants of signal lines and conductive device structures and thereby supporting higher speed switching.

One commonly used electrically insulating material having a relatively low dielectric constant is SiCOH. Unfortunately, SiCOH may be etched at a relatively high rate because it is relatively porous compared to other insulating materials such as SiO2. Hard mask layers have frequently been utilized as etch masks in order to limit over-etch of SiCOH materials. Nonetheless, lateral over-etching and undercutting of SiCOH may occur even when hard mask layers are used. This lateral over-etching is illustrated by FIG. 1. In particular, FIG. 1 illustrates an electrically insulating layer 20b formed of a material having a relatively low dielectric constant (e.g., SiCOH) and a hard mask layer 20a formed on the electrically insulating layer 20b. A photolithographically defined etching step is performed to define an opening that extends through the hard mask layer 20a and the underlying electrically insulating layer 20b. As illustrated, the etching step may result in the formation of an undercut region U having a sidewall that is laterally recessed relative to the opening in the hard mask layer 20a. The opening is then filled with an electrically conductive region 10, which may have reduced reliability as a result of the undercut region U. In particular, the presence of the undercut region U may result in the formation of a void (not shown) in the electrically conductive region 10.

SUMMARY OF THE INVENTION

Methods of forming integrated circuit devices according to embodiments of the invention include forming an electrically insulating layer on a substrate and forming a hard mask on the electrically insulating layer. The hard mask and the electrically insulating layer are etched in sequence to define an opening therein that exposes inner sidewalls of the hard mask and the electrically insulating layer. The inner sidewalls of the hard mask are then recessed relative to the inner sidewalls of the electrically insulating layer. This recession of the sidewalls of the hard mask operates to improve device yield and limit void formation in a subsequently formed conductive pattern, by accounting for recession of the sidewalls of the electrically insulating layer during subsequent process steps and thereby inhibiting the likelihood of formation of an undercut region beneath the hard mask. In particular, the sidewalls of the hard mask are preferably recessed by an amount sufficient to cause realignment of the sidewalls of the hard mask and electrically insulating layer when the sidewalls of the electrically insulating layer are subsequently recessed. This recession of the sidewalls of the electrically insulating layer may occur when a sacrificial reaction layer is formed on the inner sidewall of the electrically insulating layer and then removed.

According to additional embodiments of the invention, the step of forming an electrically insulating layer on a substrate is preceded by the steps of forming an electrically conductive pattern on the substrate and forming an etch-stop layer on the electrically conductive pattern. According to these embodiments of the invention, the step of selectively etching the hard mask and the electrically insulating layer includes selectively etching the hard mask and the electrically insulating layer in sequence to define an opening therein that exposes the etch-stop layer. The step of selectively etching the hard mask and the electrically insulating layer in sequence may also be preceded by the steps of forming a via hole (Vh) that extends through the hard mask and the electrically insulating layer and filling the via hole with a first sacrificial layer. Moreover, the step of forming a sacrificial reaction layer on the inner sidewall of the electrically insulating layer may actually occur when at least a portion of the first sacrificial layer is removed using an ashing technique. The sacrificial reaction layer may be removed from the recessed inner sidewall of the electrically insulating layer by exposing the sacrificial reaction layer to a diluted hydrofluoric acid solution.

According to still further embodiments of the present invention, the step of selectively etching the hard mask and the electrically insulating layer in sequence includes selectively etching the first sacrificial layer, the hard mask and the first electrically insulating layer in sequence to define a trench therein that exposes inner sidewalls of the first sacrificial layer, the hard mask and the electrically insulating layer. According to these embodiments of the invention, the step of recessing the inner sidewall of the hard mask includes recessing the inner sidewall of the hard mask relative to the inner sidewall of the first sacrificial layer and the inner sidewall of the electrically insulating layer by exposing the inner sidewall of the hard mask to a diluted hydrofluoric acid solution. Subsequent steps may then be performed to define a patterned conductive region in the trench. This conductive region may operate as a metal interconnect, such as a copper damascene interconnect.

BRIEF DESCRIPTION OF THE DRAWINGS

The above and other features and advantages of the invention will become more apparent by describing in detail preferred embodiments thereof with reference to the attached drawings in which.

DETAILED DESCRIPTION OF THE PREFERRED EMBODIMENTS

Figure 1:
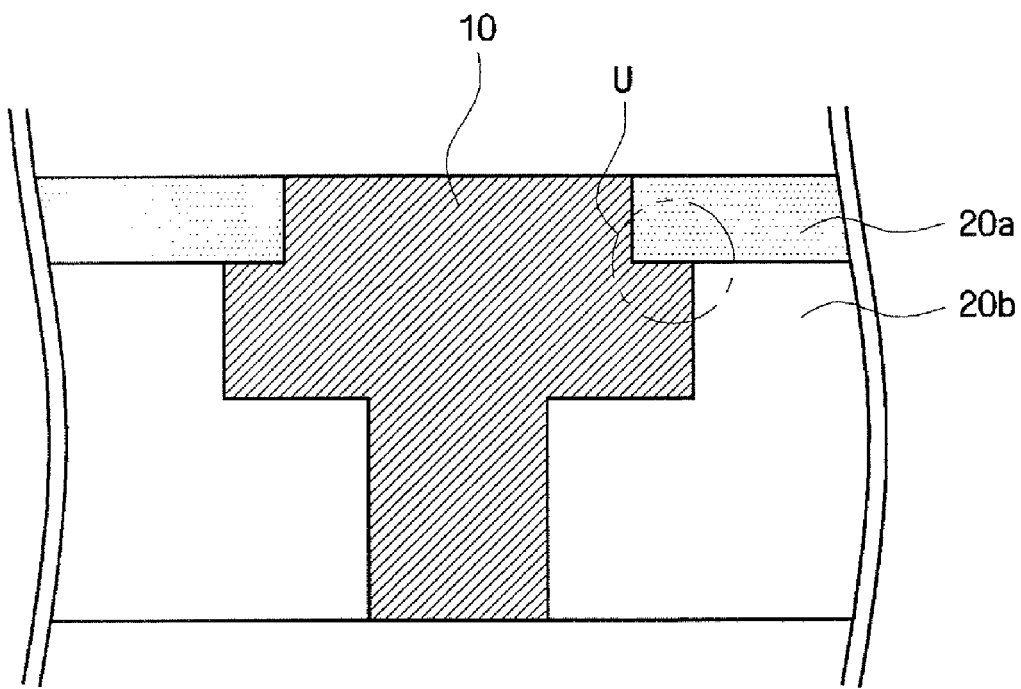
FIG. 1 illustrates a vertical profile of a conductive material that is formed by a general semiconductor manufacturing method.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims. Like reference numerals refer to like elements throughout the specification.

The embodiments in this specification will be described with reference to plan views and cross-sectional views, which are ideal schematic views. Accordingly, the forms of exemplary views may be changed according to manufacturing technology and/or allowable margin of error. Thus, the embodiments of the invention are not limited to the specific forms that are shown but include the change of the forms generated according to manufacturing processes. Accordingly, regions exemplified in the drawings are schematically shown, and the shapes of the regions exemplified in the drawings are shown to exemplify the specific shapes of regions in a device but do not limit the scope of the invention.

Figure 2:
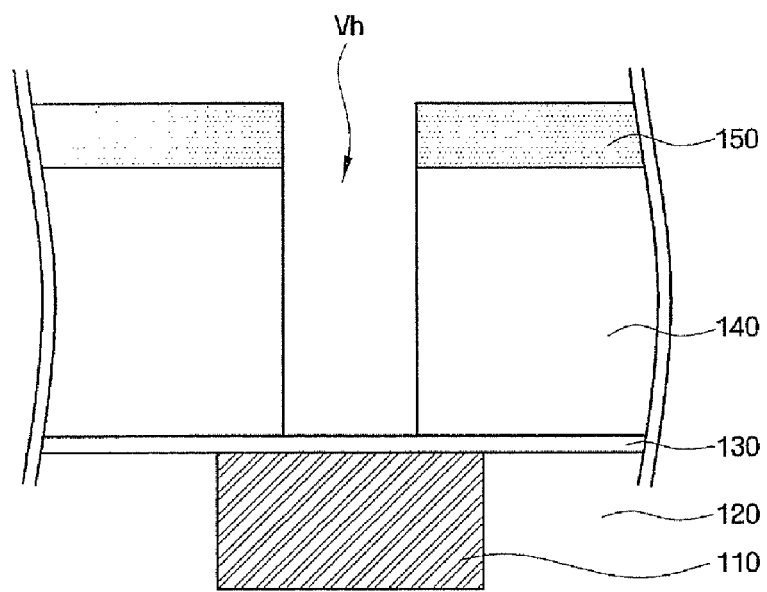
FIGS. 2-10 are cross-sectional views of intermediate structures that illustrate methods of forming integrated circuit devices according to embodiments of the present invention.

Referring now to FIG. 2, methods of forming integrated circuit devices according to embodiments of the present invention include forming a first electrically insulating layer 120 on a semiconductor substrate (not shown) and forming a first electrically conductive pattern 110 in the first electrically insulating layer 120. An etch-stop layer 130 is formed on the first electrically conductive pattern 110 and the first electrically insulating layer 120. The etch-stop layer 130 may function as a capping layer to protect the underlying first electrically insulating layer 120. A second electrically insulating layer 140 is formed on the etch-stop layer 130 and a hard mask 150 is formed on the second electrically insulating layer 140. The hard mask 150 may be photolithographically patterned (e.g., using a photo resist mask (not shown)) to define an opening therein and then an etching step may be performed to define a via hole Vth that extends through the second electrically insulating layer 140 and exposes an upper surface of the etch-stop layer 130. During this etching step, the patterned hard mask 150 may be used as a "sub-etching" mask with the photo resist mask (not shown) operating as a primary etching mask. The etching step may include a dry "anisotropic" etching step or a plasma etching step, for example.

According to some embodiments of the present invention, the first electrically conductive pattern 110 may be a semiconductor junction region (e.g., N+ or P+ region), a metal pattern (e.g., copper pattern, metal salacity pattern) or an electrically conductive line, for example. One example of an electrically conductive line is a doped or undoped polysilicon line. In other embodiments of the invention, the first electrically insulating layer 120 may be replaced by a semiconductor substrate region.

The first electrically insulating layer 120 may be formed as a silicon oxide layer. In particular, the first electrically insulating layer 120 may be formed as a SiCOH layer, which has a relatively low dielectric constant and relatively high porosity. The use of a material having a relatively low dielectric constant may improve device performance (e.g., increase switching speed) by reducing parasitic coupling capacitances between adjacent electrically conductive regions and structures. Alternative electrically insulating materials having relatively low dielectric constants include OMCTS (octamethylcyclotetrasiloxane) and TMCTS (tetramethycyclotetrasiloxane), for example.

As understood by those skilled in the art, increasing the porosity of an electrically insulating material may result in a decrease in the dielectric constant of the material. One technique to increase the porosity of an electrically insulating material includes forming organic material dots within the insulating material as the electrically insulating layer is being formed. Once formed, the organic material dots may be removed from the layer to thereby define porous vacancies within the layer. For example, a first electrically insulating layer 120 may be formed using a thermal deposition method and/or plasma deposition method. During these methods, a source gas containing gaseous SiCOH (or a combination of silane systemic gas, $O_2$, $H_2$, C, $CO_2$ and $C_xH_yO_z$) may be provided to a deposition chamber to form the insulating layer 120 containing organic material dots therein. Then, an ashing step and/or annealing step under an oxygen atmosphere may be performed to remove the organic material dots within the insulating layer 120.

The etch-stop layer 130 may be formed of a material having a greater etch resistance relative to the first electrically insulating layer 120. In particular, the etch-stop layer 130 may be formed as an inorganic material layer, such as an $SiO_2$ layer, a silicon nitride layer, a silicon oxynitride layer or a $Si_xC_yN_z$ layer. The second electrically insulating layer 140 may be formed of the same material as the first electrically insulating layer 120.

The hard mask 150 may be formed of a material having a greater etch resistance relative to the second electrically insulating layer 140. In some embodiments of the invention, the hard mask 150 is formed of the same material as the etch-stop layer 130. In other embodiments of the invention, the hard mask 150 may be formed as a low temperature silicon oxide layer (e.g., tetraethylorthosilicate (TEOS)), such as a silicon oxide layer formed at a temperature of 400° C. or below 400° C. In alternative embodiments of the invention, the hard mask 150 may be formed as a composite of multiple layers. For example, in the event the second electrically insulating layer 140 is formed as a SiCOH layer, then the hard mask 150 may be formed as a composite of an OMCTS layer (or TMCTS layer) and a TEOS layer. The hard mask 150 may also be formed as a composite of silicon oxide and silicon nitride layers (e.g., an oxide-nitride-oxide (ONO) composite layer).

Figure 3:
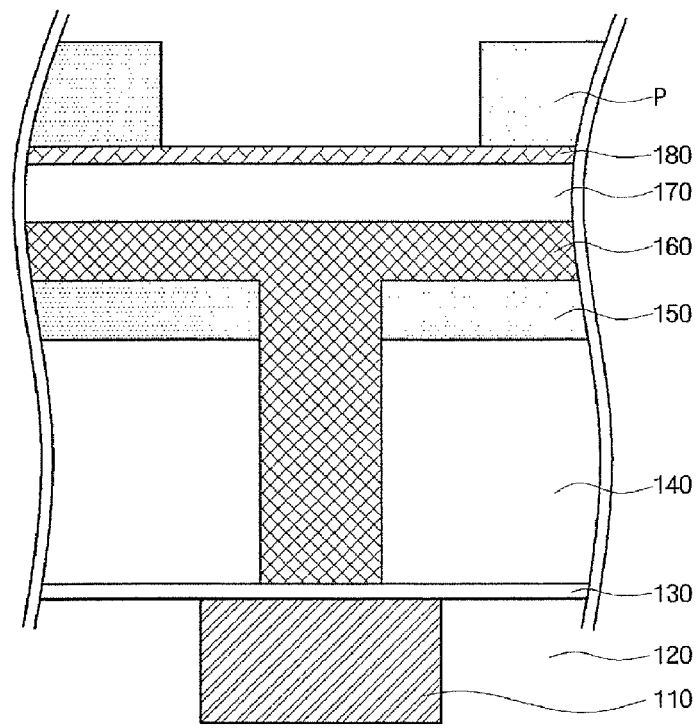

Referring now to FIG. 3, the via hole Vh is filled by depositing a first sacrificial layer 160 as a blanket layer on the patterned hard mask 150. This first sacrificial layer 160 may be formed of an organic material. Thereafter, a second sacrificial layer 170 is deposited on the first sacrificial layer 160 and an anti-reflective coating 180 (ARC) is deposited on the second sacrificial layer 170. In contrast to the first sacrificial layer 160, the second sacrificial layer 170 may be formed of an inorganic material and may even be formed of the same material as the hard mask 150. A photoresist layer is then deposited on the anti-reflective coating 180 and patterned to define a photoresist pattern (P) thereon.

According to some embodiments of the present invention, the second sacrificial layer 170 may be formed as a low temperature silicon oxide layer. In particular, the second sacrificial layer 170 may be formed at a temperature of 400° C. or below 400° C. In alternative embodiments of the invention, the second sacrificial layer 170 may be formed at a temperature of 1000° C. or less. For example, the second sacrificial layer 170 may be formed at an intermediate temperature in a range between 400° C. and 800° C.

The anti-reflective coating 180 may be formed as an organic material layer or an inorganic material layer. For example, the anti-reflective coating 180 may be formed as an organic material layer in the event the underlying second sacrificial layer 170 is formed as an inorganic material layer. Alternatively, if the anti-reflective coating 180 is formed as an inorganic material layer, such as silicon oxynitride, it may be selectively etched relative to an underlying second sacrificial layer 170 formed of silicon nitride.

Figure 4:
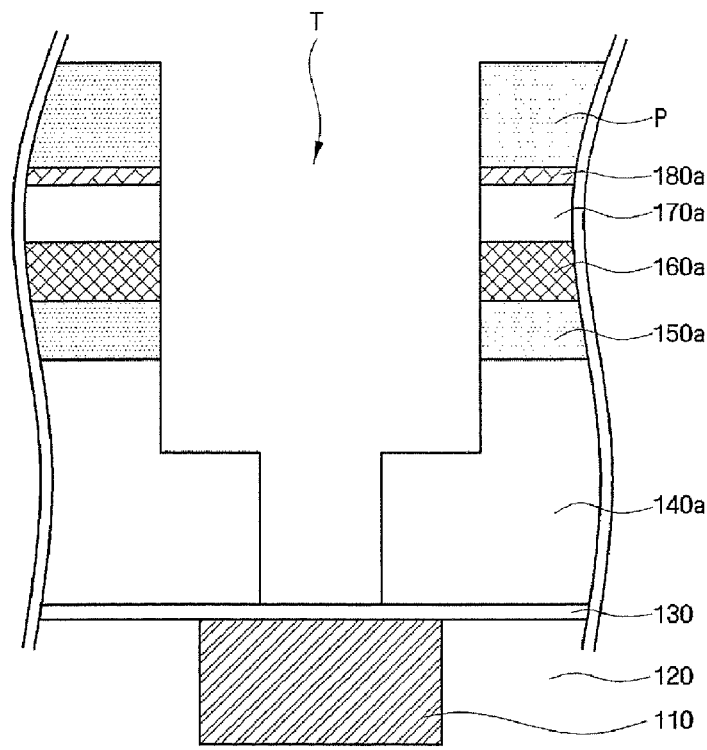

Referring now to FIG. 4, the anti-reflective coating 180, second sacrificial layer 170, first sacrificial layer 160, hard mask 150 and second electrically insulating layer 140 are sequentially etched to define a trench T that exposes the etch-stop layer 130. As illustrated, the masked sequential etching step results in the formation of a anti-reflective coating pattern 180a, second sacrificial layer pattern 170a, first sacrificial layer pattern 160a, hard mask pattern 150a and second electrically insulating layer pattern 140a.

In the event the anti-reflective coating 180 is formed of an organic material, then the anti-reflective coating pattern 180a may be formed when the photoresist pattern P is formed. In the event the second sacrificial layer 170 is formed of an inorganic material (e.g., silicon dioxide), then the second sacrificial layer 170 may be dry etched using a halogen group element. Examples of gases containing halogen group elements include $C_xF_y$, $C_xH_yF_z$, $WF_6$, HBr and $CCl_4$. Alternatively, the second sacrificial layer 170 may be patterned using a wet etching method that includes a hydrofluoric acid (HF) solution. In addition, portions of the first sacrificial layer 160 that are not covered by the second sacrificial layer pattern 170a during the sequential etching step may be removed by ashing or other etching step to remove organic materials.

The hard mask 150 may be patterned using the same techniques used to form the second sacrificial layer pattern 170a. In particular, in the event the hard mask 150 is formed of an inorganic material, such as silicon dioxide, then the hard mask 150 may be dry etched using a halogen group element. Alternatively, the hard mask 150 may be patterned using a wet etching method that includes a hydrofluoric acid (HF) solution.

The trench T is formed in the second electrically insulating layer 140 by using the plurality of patterned layers 150a, 160a, 170a and 180a as an etch mask. The etching step used to form the trench T may be controlled to have a sufficient duration to completely remove the first sacrificial layer 160 from the via hole Vh and expose an upper surface of the etch-stop layer 130. This etching step may include plasma etching the second electrically insulating layer 140.

Figure 5:
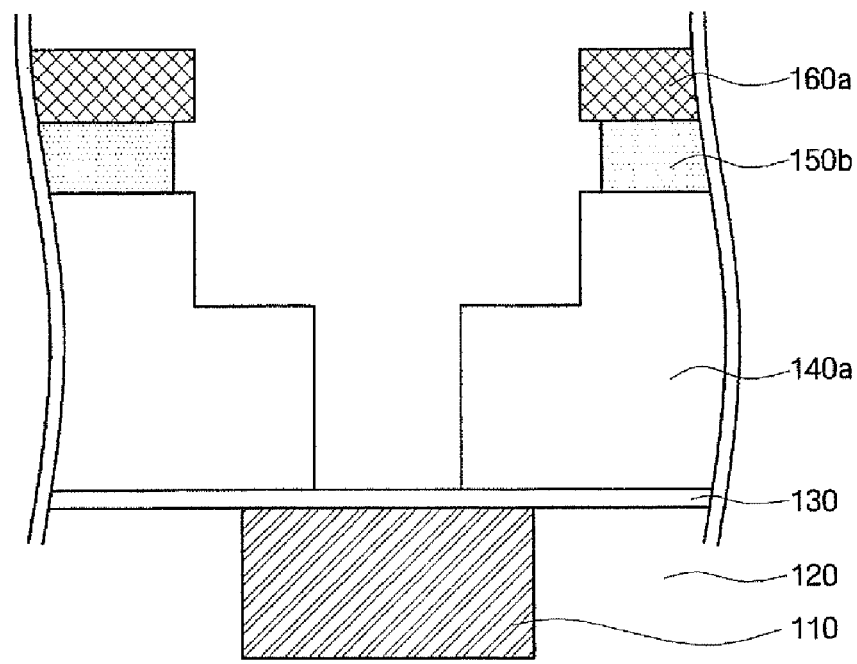

Referring now to FIG. 5, the photoresist pattern P, the anti-reflection coating pattern 180a and the second sacrificial layer pattern 170a are removed to expose the underlying first sacrificial layer pattern 160a. Thereafter, the exposed sidewalls of the hard mask pattern 150a are recessed to define a recessed hard mask pattern 150b. This recession of the exposed sidewalls may be performed by exposing the hard mask 150a to a wet etching solution, such as a diluted hydrofluoric acid (HF) solution. The concentration of the diluted HF may be set at a volume ratio of 200:1 (i.e., $H_2O$ (volume):HF (volume)=200:1). Other concentrations may also be used depending on application and characteristics of the hard mask pattern 150a and surrounding layers. The substantial recession of the exposed sidewalls of the hard mask pattern 150a relative to the minimal recession, if any, of the exposed sidewalls of the second electrically insulating layer pattern 140a may be enhanced by using a hard mask 150 formed of a material that is relatively hydrophilic and a second electrically insulating layer 140 formed of a material that is relatively hydrophobic.

A plasma treatment may be performed to enhance the hydrophilic characteristics of the hard mask pattern 150a and enhance the hydrophobic characteristics of the second electrically insulating layer pattern 140a. For example, the plasma treatment may include the use of gases containing carbon, a halogen group element(s), nitrogen, hydrogen, an inert gas and combinations thereof. Alternative plasma compositions and treatments may also be performed in alternatively embodiments of the invention. The formation of the second electrically insulating layer pattern 140a by plasma etching the second electrically insulating layer 140 may also result in an increase in the hydrophobic properties of the second electrically insulating layer pattern 140a.

Figure 6:
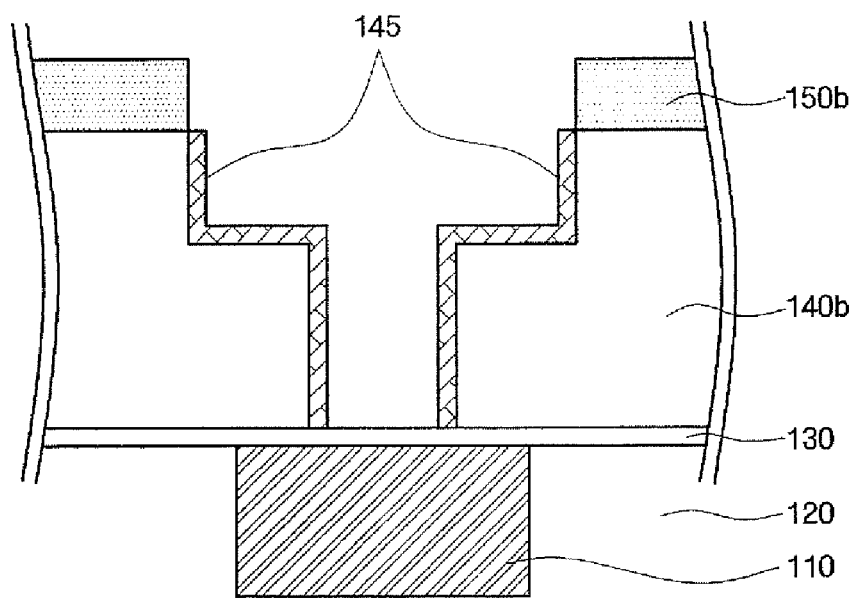
Figure 7:
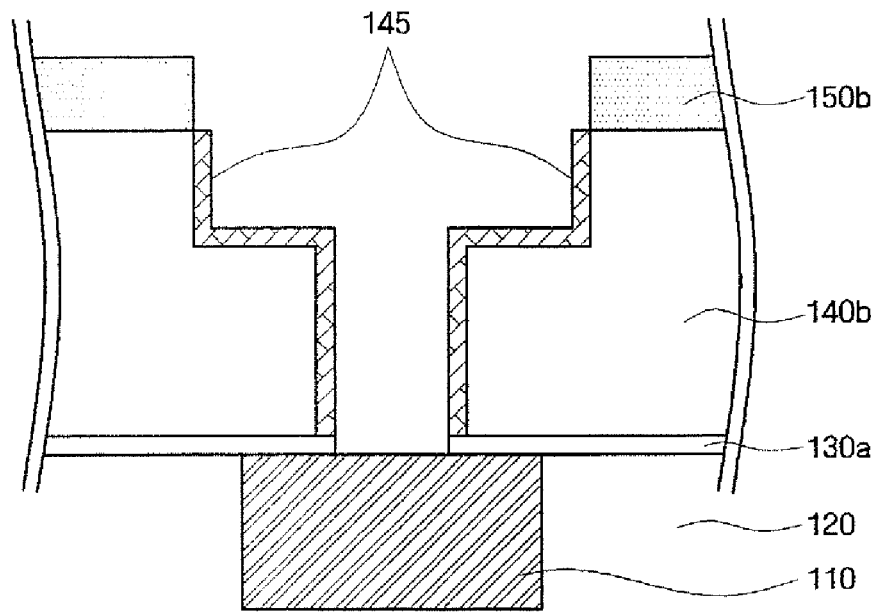

Referring now to FIG. 6, an ashing process is performed on the intermediate structure of FIG. 5 to thereby remove the first sacrificial layer pattern 160a. This ashing process may result in the formation of a reaction layer 145 along exposed portions of a recessed second electrically insulating layer pattern 140b. This reaction layer 145 may be treated as a plasma reaction layer. In particular, the formation of the reaction layer 145 may operate to modify the characteristics of the exposed portions of the recessed second electrically insulating layer pattern 140b by increasing the hydrophilic properties of the exposed portions. The ashing process may be performed for a sufficient duration to convert the exposed portions from hydrophobic to hydrophilic.

Figure 8:
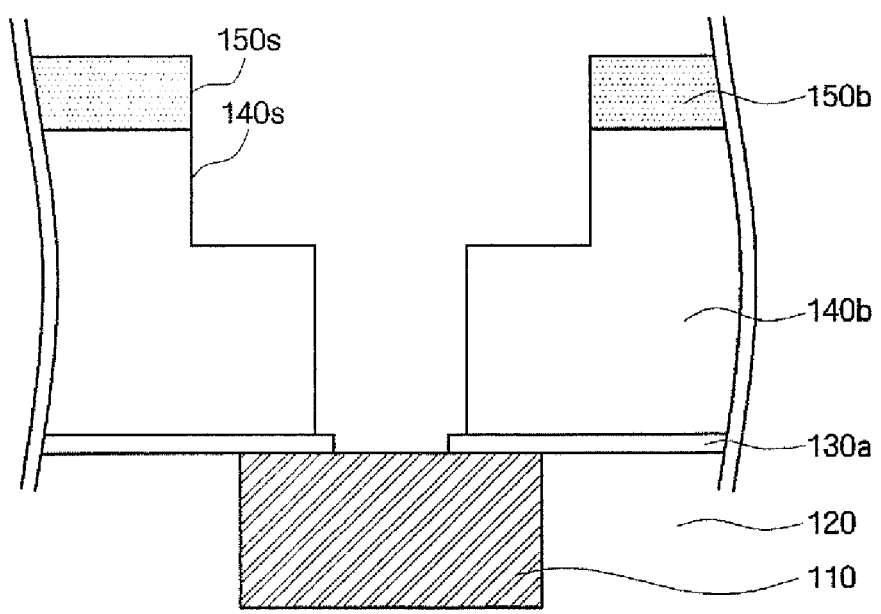

Referring now to FIG. 8, the exposed portion of the etch-stop layer 130 is then removed to define an etch-stop layer pattern 103a. The etch-stop layer 130 may be etched using both dry etching or wet etching techniques. In the event a wet etching process is used, then an acid such as phosphoric acid, nitric acid, sulfuric acid, hydrochloric acid, hydrofluoric acid and combinations of these acids may be used depending on the material characteristics of the etch-stop layer 130. However, if a dry etching process is used, then a plasma etching technique may be performed using a combination of carbon, halogen and an inert gas, for example.

Referring now to FIG. 8, the reaction layer 145 is removed from the recessed second electrically insulating layer pattern 140b. This reaction layer 145 may be removed using a wet etching solution containing hydrofluoric acid. It is preferably that the composition of this wet etching solution be designed to have relatively limited impact on the recessed hard mask pattern 150b (i.e., not significantly etch the hard mask pattern 150b). The removal of the reaction layer 145 also illustrates an alignment between inner sidewalls 150s of the recessed hard mask pattern 150b and inner sidewalls of the recessed second electrically insulating layer pattern 140b.

Figure 9:
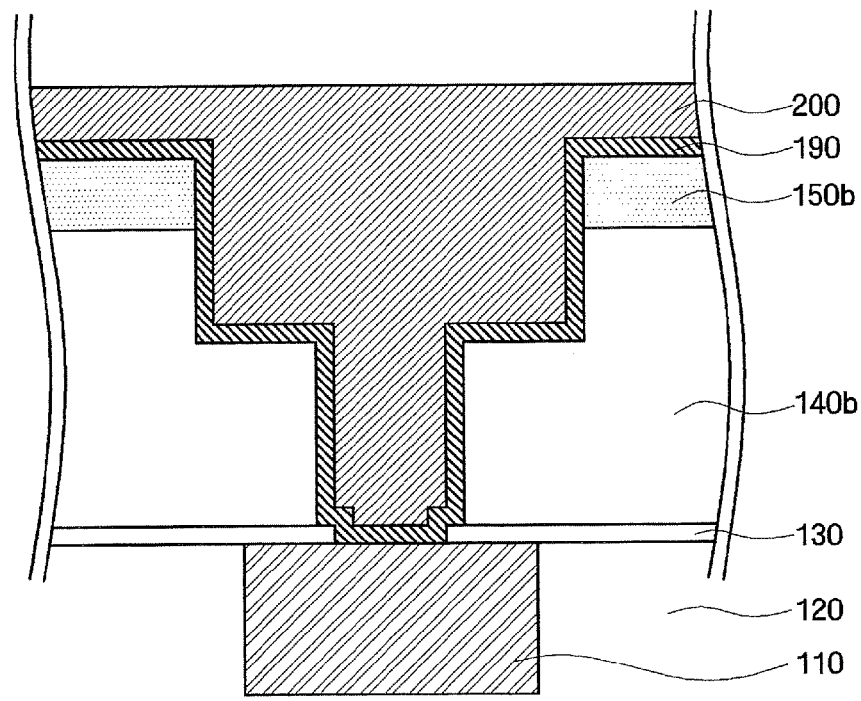

Referring now to FIG. 9, an electrically conductive liner 190 is conformally deposited on the intermediate structure of FIG. 8. As illustrated, this electrically conductive liner 190 contacts an exposed upper surface of the first electrically conductive pattern 110 and lines sidewalls of the recessed second electrically insulating layer pattern 140b and sidewalls and an upper surface of the recessed hard mask pattern 150b. The electrically conductive liner 190 may be formed as a single conductive layer or as a multilayer. In particular, the liner 190 may be formed as a Ti/TiN layer, a WN layer or a TaN layer, for example, however other materials may also be used. The liner 190 may be formed by electroplating, electroless plating and/or sputter depositing. Sputter depositing may include forming a seed layer and then plating a conductive layer on the seed layer. The formation of the conductive liner 190 is followed by the formation of an electrically conductive layer 200 (e.g., copper layer) that fills the trench T.

Figure 10:
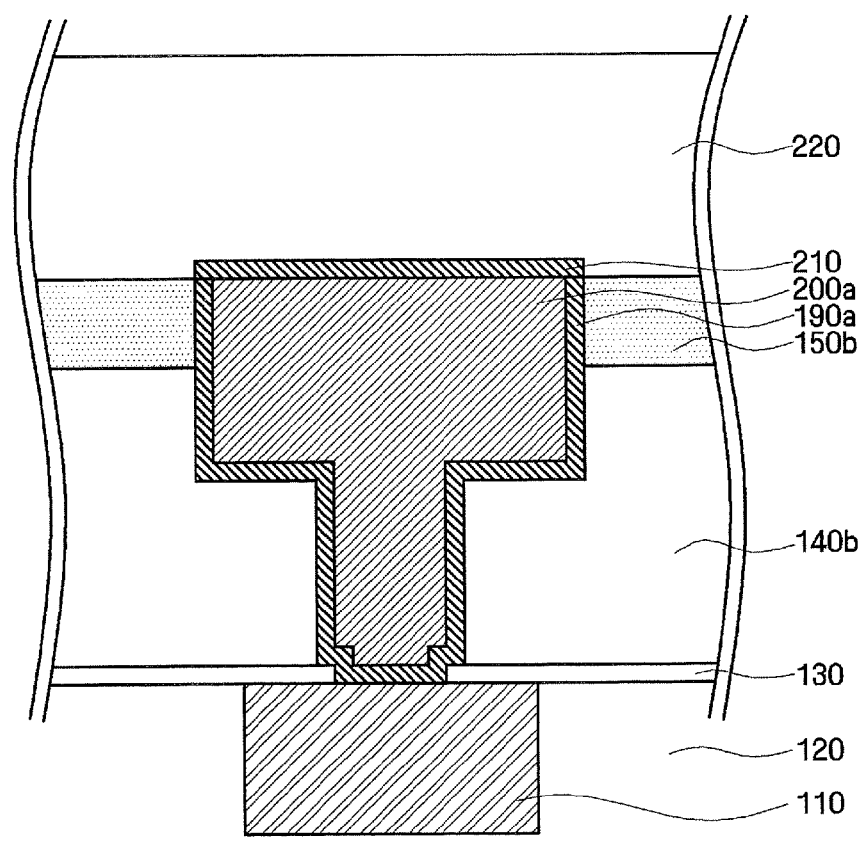

Referring now to FIG. 10, the electrically conductive layer 200 (and liner 190) is then planarized to have an upper surface that is coplanar with the recessed hard mask pattern 150b, to thereby define an electrically conductive pattern 200a. Thereafter, an electrically conductive capping layer 210 is formed on the planarized surface of the electrically conductive pattern 200a. According to some embodiments of the present invention, the capping layer 210 may be formed of the same material as the liner 190. A third electrically insulating layer 220 is then formed on the capping film 210 and the recessed hard mask pattern 150b. In additional embodiments of the present invention, the third electrically insulating layer 220 may be formed of the same material as the first and second electrically insulating layers.

Figure 11A:
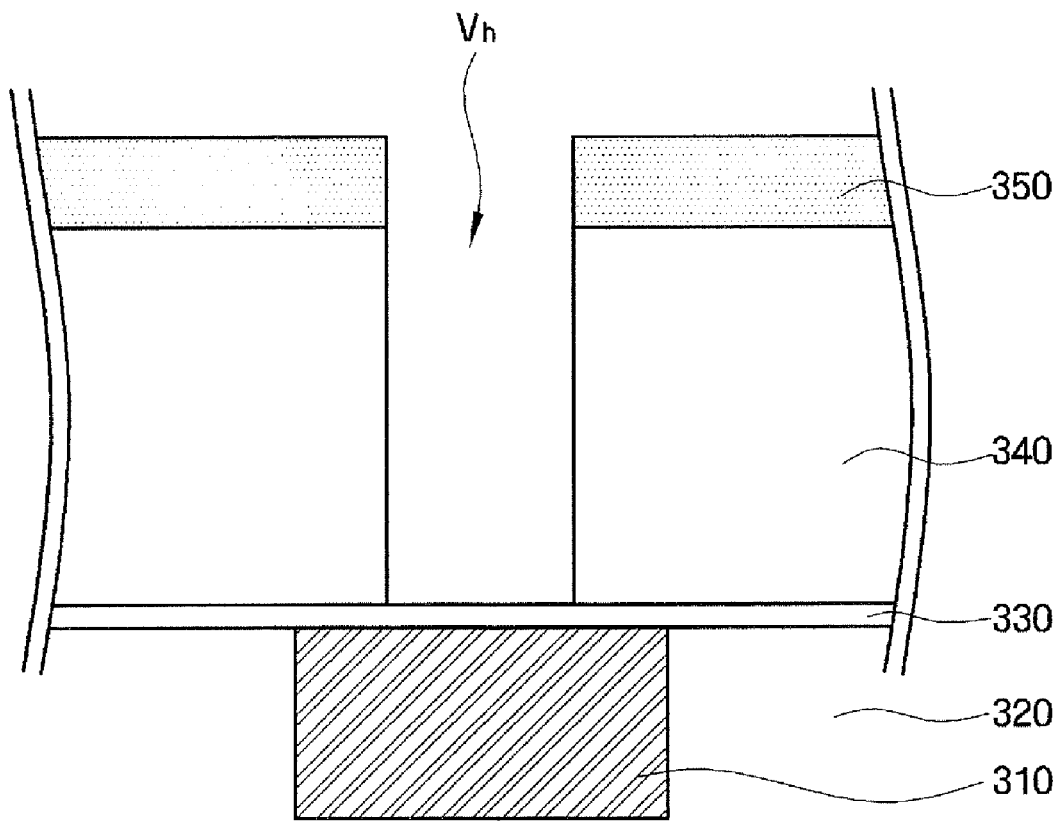
FIGS. 11A-11E are cross-sectional views of intermediate structures that illustrate methods of forming integrated circuit devices according to additional embodiments of the present invention.

FIGS. 11A-11E illustrate methods of forming integrated circuit devices according to additional embodiments of the present invention. As illustrated by FIG. 11A, a first electrically conductive pattern 310 is formed in a first electrically insulating layer 320. Then, an etch-stop layer 330 is formed on the first electrically conductive pattern 310 and the first electrically insulating layer 320. This etch-stop layer 330 is then covered by a second electrically insulating layer 340. A hard mask 350 is formed on an upper surface of the second electrically insulating layer 340. A photolithographically defined etching step is then performed to selectively etch through the hard mask 350 and the second electrically insulating layer 340 to define a via hole Vh therein, which exposes an upper surface of the etch-stop layer 330 and inner sidewalls of the hard mask 350 and the second electrically insulating layer 340. At this point in the process, the intermediate structure illustrated by FIG. 11A is the same as the intermediate structure illustrated by FIG. 2, including the alternative embodiments described with respect to FIG. 2.

Figure 11B:
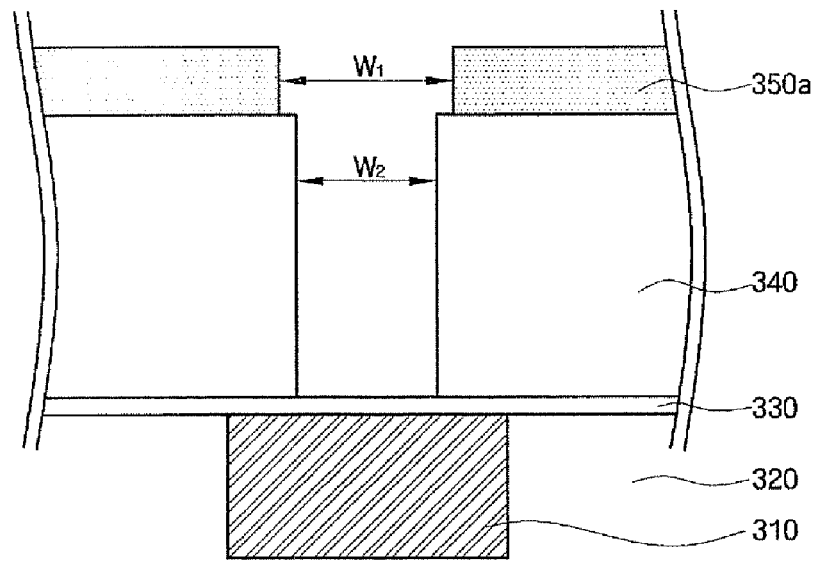

Referring now to FIG. 11B, a selective etching step is performed to laterally recess the inner sidewalls of the hard mask 350 relative to the inner sidewalls of the second electrically insulating layer 340, and thereby define a modified hard mask 350a. Thus, the width $W_1$ of the opening in the modified hard mask 350a is greater than the width $W_2$ of the opening in the second electrically insulating layer 340. This selective etching step to recess the sidewalls of the hard mask may be the same as the corresponding etching step illustrated and described hereinabove with respect to FIG. 5.

Figure 11C:
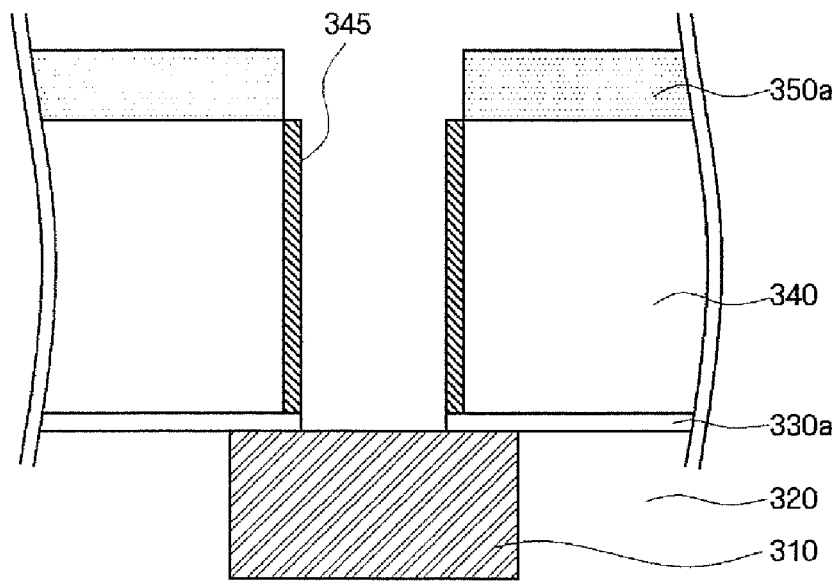
Figure 11D:
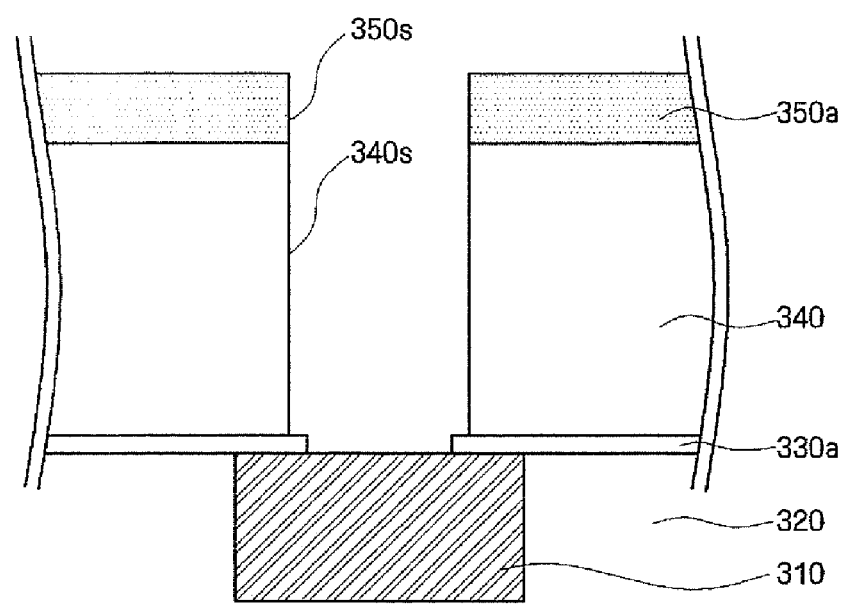
Figure 11E:
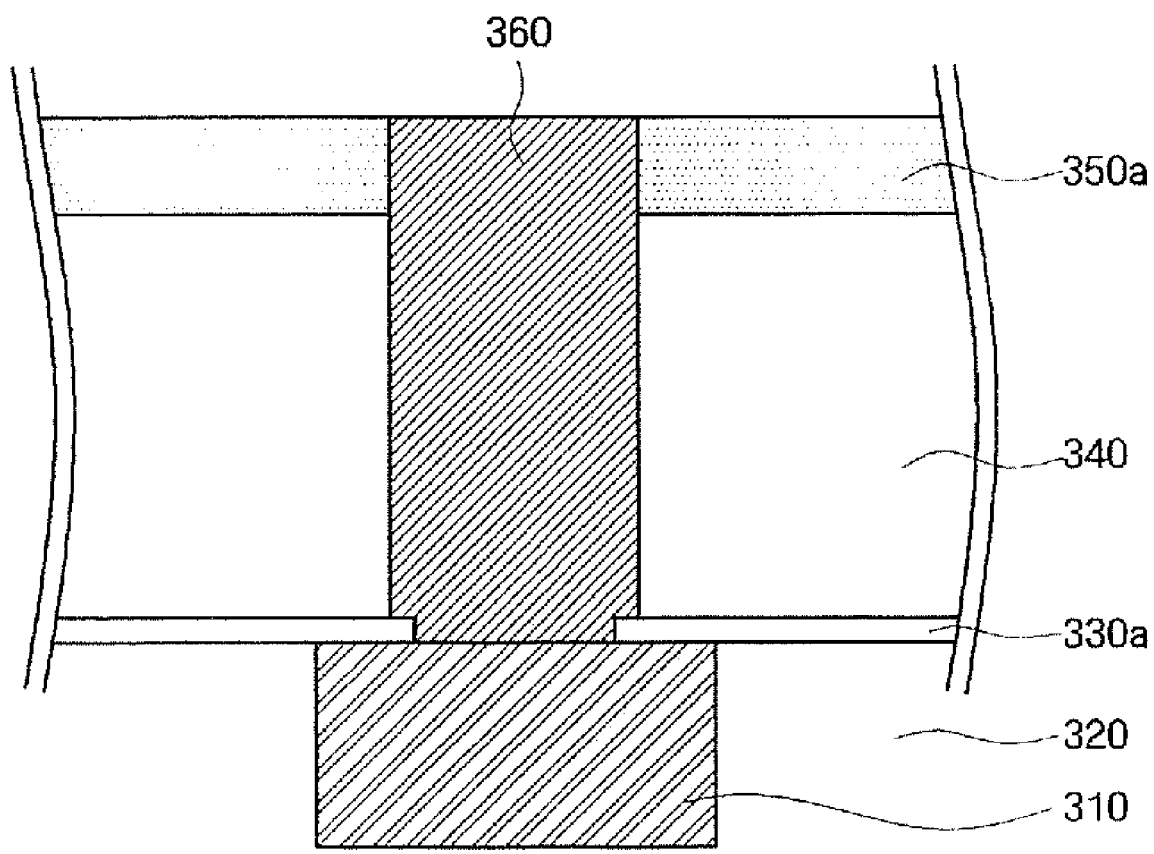

Referring now to FIG. 11C, the exposed upper surface of the etch-stop layer is then selectively etched for a sufficient duration to expose an underlying upper surface of the first electrically conductive pattern 310. During this selective etching step, a reaction layer 345 may be formed on the inner sidewall of the second electrically insulating layer 340. The reaction layer 345 is then removed, as illustrated by FIG. 11D. This removal of the reaction layer 345 exposes recessed inner sidewalls (340s) of the second electrically insulating layer 340, which are relatively aligned with the previously recessed inner sidewalls (350s) of the modified hard mask 350a. However, it is preferable that the inner sidewalls of the modified hard mask 350a be slightly more recessed relative to the inner sidewalls of the second electrically insulating layer 340 to prevent undercutting. Finally, as illustrated by FIG. 11E, an electrically conductive via plug 360 (with or without conductive liner/barrier layer) is formed within the via hole Vh using conventional techniques to define, in some embodiments, a metal damascene interconnect.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit device, comprising:
    forming an electrically insulating layer on a substrate;
    forming a hard mask on the electrically insulating layer;
    selectively etching the hard mask and the electrically insulating layer in sequence to define an opening therein that exposes inner sidewalls of the hard mask and the electrically insulating layer
    recessing the inner sidewall of the hard mask relative to the inner sidewall of the electrically insulating layer, using a sacrificial first layer on the hard mask as an etching mask;
    removing the sacrificial first layer while concurrently forming a reaction layer on the inner sidewall of the electrically insulating layer that recesses the inner sidewall of the electrically insulating layer;
    selectively etching a portion of the substrate in the opening using the reaction layer as an etching mask; and then
    removing the reaction layer from the recessed inner sidewall of the electrically insulating layer.

2. The method of claim 1, wherein forming an electrically insulating layer on a substrate is preceded by the steps of forming an electrically conductive pattern on the substrate and forming an etch-stop layer on the electrically conductive pattern;
    and wherein selectively etching the hard mask and the electrically insulating layer comprises selectively etching the hard mask, the sacrificial first layer and the electrically insulating layer in sequence to define an opening therein that exposes the etch-stop layer.

3. The method of claim 2, wherein selectively etching the hard mask, the sacrificial first layer and the electrically insulating layer in sequence is preceded by the steps of:
    forming a via hole that extends through the hard mask and the electrically insulating layer; and
    filling the via hole and covering the hard mask with the sacrificial first layer.

4. The method of claim 3, wherein forming a reaction layer on the inner sidewall of the electrically insulating layer comprises removing at least a portion of the sacrificial first layer using an ashing technique.

5. The method of claim 4, wherein removing the reaction layer from the recessed inner sidewall of the electrically insulating layer comprises exposing the reaction layer to a diluted hydrofluoric acid solution.

6. The method of claim 5, wherein selectively etching the hard mask and the electrically insulating layer in sequence comprises selectively etching the sacrificial first layer, the hard mask and the first electrically insulating layer in sequence to define a trench therein that exposes inner sidewalls of the sacrificial first layer, the hard mask and the electrically insulating layer.

7. The method of claim 3, wherein selectively etching the hard mask and the electrically insulating layer in sequence comprises selectively etching the sacrificial first layer, the hard mask and the first electrically insulating layer in sequence to define a trench therein that exposes inner sidewalls of the sacrificial first layer, the hard mask and the electrically insulating layer.

8. The method of claim 7, wherein recessing the inner sidewall of the hard mask comprises recessing the inner sidewall of the hard mask relative to the inner sidewall of the sacrificial first layer and the inner sidewall of the electrically insulating layer.

9. The method of claim 8, wherein recessing the inner sidewall of the hard mask comprises exposing the inner sidewall of the hard mask to a diluted hydrofluoric acid solution.

10. The method of claim 7, wherein removing the reaction layer from the recessed inner sidewall of the electrically insulating layer is followed by the step of filling the trench with a metal interconnect structure.

11. The method of claim 1, wherein the electrically insulating layer comprises SiCOH.

12. The method of claim 1, wherein the hard mask comprises a material selected from a group consisting of silicon oxide, an organic metal oxide, silicon nitride and silicon oxynitride.

13. The method of claim 1, wherein forming a reaction layer comprises exposing the inner sidewall of the electrically insulating layer to a plasma.

14. The method of claim 13, wherein exposing the inner sidewall of the electrically insulating layer to a plasma comprises exposing the inner sidewall of the electrically insulating layer to a plasma for a sufficient duration to convert the surface of the inner sidewall from hydrophobic to hydrophilic.

15. A method of forming an integrated circuit device, comprising:
    forming an electrically conductive pattern on the substrate;
    forming an etch-stop layer on the electrically conductive pattern;
    forming an electrically insulating layer on the etch-stop layer;
    forming a hard mask on the electrically insulating layer;
    selectively etching the hard mask and the electrically insulating layer in sequence to define a via hole therein that exposes the etch-stop layer;
    filling the via hole with an electrically insulating sacrificial layer;
    selectively etching the sacrificial layer, the hard mask and the electrically insulating layer in sequence to define an opening therein that exposes inner sidewalls of the sacrificial layer, the hard mask and the electrically insulating layer and exposes an upper surface of the etch-stop layer;
    selectively etching the inner sidewall of the hard mask relative to the inner sidewall of the electrically insulating layer for a sufficient duration to achieve a hard mask having an inner sidewall that is recessed relative to the inner sidewall of the electrically insulating layer;
    removing at least a portion of the sacrificial layer using an ashing technique that forms a reaction layer on the inner sidewall of the electrically insulating layer;
    selectively etching the exposed upper surface of the etch-stop layer to expose the electrically conductive pattern using the reaction layer as an etching mask; then
    removing the reaction layer from within the opening; and then
    filling the opening with an electrical interconnect that is electrically connected to the electrically conductive pattern.

16. The method of claim 15, wherein the electrically insulating layer comprises SiCOH.

17. The method of claim 15, wherein the hard mask comprises a material selected from a group consisting of silicon oxide, an organic metal oxide, silicon nitride and silicon oxynitride.

18. The method of claim 15, wherein said filling the opening with an electrical interconnect is preceded by forming a liner on the inner sidewall of the electrically insulating layer.

* * * * *